United States Patent [19]

Michaud

[11] Patent Number: 5,268,120

[45] Date of Patent: Dec. 7, 1993

[54] COMPOSITION BASED ON 1,1-DICHLORO-1-FLUOROETHANE, 1,1,1,3,3-PENTAFLUOROBUTANE AND METHANOL, FOR CLEANING AND/OR DRYING SOLID SURFACES

[75] Inventor: Pascal Michaud, Saint-Gratien, France

[73] Assignee: Elf Atochem, S.A., France

[21] Appl. No.: 876,265

[22] Filed: Apr. 30, 1992

[30] Foreign Application Priority Data

May 2, 1991 [FR] France ............................ 91 05396

[51] Int. Cl.$^5$ .................... C11D 7/30; C11D 7/50; C23G 5/028; B08B 3/00
[52] U.S. Cl. .................... 252/162; 252/170; 252/171; 252/364; 252/DIG. 9; 134/12; 134/31; 134/38; 134/40; 134/42; 203/67; 570/164; 570/177; 570/178
[58] Field of Search ............... 252/162, 170, 171, 364, 252/DIG. 9; 134/12, 31, 38, 40, 42; 203/67; 570/164, 177, 178

[56] References Cited

U.S. PATENT DOCUMENTS

| | | | |
|---|---|---|---|
| 4,748,223 | 5/1988 | Haruyoshi et al. | 526/206 |
| 4,816,174 | 3/1989 | Lund et al. | 252/171 |
| 4,842,764 | 6/1989 | Lund et al. | 252/171 |
| 4,943,622 | 7/1990 | Naraki et al. | 526/206 |
| 4,950,364 | 8/1990 | Wismer | 203/50 |
| 5,059,728 | 10/1991 | Li et al. | 570/134 |
| 5,073,291 | 12/1991 | Robeck et al. | 252/171 |
| 5,099,081 | 3/1992 | Bolmer et al. | 570/180 |
| 5,099,082 | 3/1992 | Bolmer et al. | 570/180 |
| 5,145,598 | 9/1992 | Swan et al. | 252/171 |
| 5,152,913 | 10/1992 | Desbiendrus et al. | 252/171 |
| 5,211,867 | 5/1993 | Shankland et al. | 252/67 |
| 5,219,490 | 6/1993 | Basn et al. | 252/171 |

FOREIGN PATENT DOCUMENTS

| | | |
|---|---|---|
| 2009169 | 4/1990 | Canada . |
| WO89/10984 | 11/1989 | European Pat. Off. . |
| 0381986 | 8/1990 | European Pat. Off. . |
| 431458 | 6/1991 | European Pat. Off. . |
| 432672 | 6/1991 | European Pat. Off. . |

OTHER PUBLICATIONS

French Search Report Dated Jan. 16, 1992.

Primary Examiner—Christine Skane
Assistant Examiner—Michael P. Tierney
Attorney, Agent, or Firm—Morgan & Finnegan

[57] ABSTRACT

To replace the cleaning compositions based on 1,1,2-trichloro-1,2,2-trifluoroethane (F113), the invention proposes a composition comprising, on a weight basis, 60 to 90% of 1,1-dichloro-1-fluoroethane (F141b), 9 to 33% of 1,1,1,3,3-pentafluorobutane (F365 mfc) and 1 to 7% of methanol. These three compounds form a positive azeotrope (b.p.=29.1° C. at normal pressure).

The composition, optionally stabilized, can be employed for the cleaning and/or drying of solid surfaces, in particular for the defluxing of printed circuits and for the degreasing of mechanical components.

10 Claims, No Drawings

COMPOSITION BASED ON 1,1-DICHLORO-1-FLUOROETHANE, 1,1,1,3,3-PENTAFLUOROBUTANE AND METHANOL, FOR CLEANING AND/OR DRYING SOLID SURFACES

FIELD OF THE INVENTION

The present invention relates to the field of fluorinated and chlorofluorinated hydrocarbons. Its subject is more particularly a new composition exhibiting an azeotrope and capable of being employed in the applications for drying, cleaning, degreasing and dry-cleaning of solid surfaces, in particular in the defluxing and cold cleaning of printed circuits.

BACKGROUND OF THE INVENTION 1,1,2-Trichloro-1,2,2-trifluoroethane (known in the trade under the designation F113) is widely employed in industry for cleaning and degreasing solid surfaces. In addition to its application in electronics to the cleaning of solder fluxes for removing the pickling flux which adheres to the printed circuits, it is possible to mention its applications to the degreasing of heavy metal components and to the cleaning of high quality and high precision mechanical components such as, for example, gyroscopes and military or aerospace hardware. In its diverse applications F113 is in most cases used in combination with other organic solvents (for example methanol), preferably in the form of azeotropic or pseudoazeotropic mixtures which do not demix and which, employed at reflux, have substantially the same composition in the vapor phase as in the liquid phase.

However, F113 forms part of the completely halogenated chlorofluorocarbons which are at present suspected of attacking or degrading stratospheric ozone.

To contribute to solving this problem, the present invention proposes to replace F113-based compositions with a new composition based on 1,1,1,3,3-pentafluorobutane, methanol and 1,1-dichloro-1-fluoroethane. This latter compound, known in the trade under the designation F141b, is practically devoid of any destructive effect on ozone. The same applies to 1,1,1,3,3-pentafluorobutane, known in the trade under the designation F365 mfc.

The composition to be employed according to the invention contains from 60 to 90% by weight of F141b, from 9 to 33% of F365 mfc and from 1 to 7% of methanol. In this range there is an azeotrope whose boiling point is 29.1° C. at normal atmospheric pressure (1.013 bar) and the composition according to the invention has a pseudoazeotropic behaviour, that is to say that the composition of the vapour and liquid phases is substantially the same, which is particularly advantageous for the intended applications. The F141b content is preferably chosen between 75 and 82% by weight, that of F365 mfc between 15 and 21% by weight and that of methanol between 3 and 4% by weight.

The composition according to the invention additionally has the major advantage of not exhibiting any flash point under the standard conditions of determination (ASTM standard D 3828); the composition is therefore nonflammable.

The F141b/F365 mfc/methanol azeotrope is a positive azeotrope since its boiling point (29.1° C.) is lower than that of the constituents (F141b: 32° C.; F365 mfc: 40° C.; methanol: 65° C.).

As in the known compositions based on F113, the composition according to the invention can be advantageously stabilized against hydrolysis and/or radical attacks likely to arise in the cleaning processes, by adding to it a conventional stabilizer such as, for example, a nitroalkane, it being possible for the proportion of stabilizer to range from 0.01 to 5% relative to the total weight: F141b+F365 mfc+methanol.

The composition according to the invention can be employed in the same applications and using the same techniques as the previous compositions based on F113.

EXAMPLES

The following examples illustrate the invention without limiting it.

EXAMPLE 1

Demonstration of the Azeotrope 100 g of F365 mfc, 100 g of methanol and 100 g of F141b are introduced into the boiler of a distillation column (30 plates). The mixture is then put under total reflux for one hour to bring the system to equilibrium. A fraction (approximately 50 g) is removed at the temperature plateau (29.1° C.) and is analyzed by gas phase chromatography.

Inspection of the results, listed in the following table, shows the presence of a F141b/F365 mfc/methanol azeotrope.

|  | COMPOSITION (weight %) | | |
| --- | --- | --- | --- |
|  | F141b | F365 mfc | Methanol |
| Initial mixture | 33.3 | 33.3 | 33.4 |
| Fraction removed | 79.5 | 17.1 | 3.4 |

EXAMPLE 2

Verification of the Azeotropic Composition 200 g of a mixture containing, on a weight basis, 79.5% of F141b, 17.1% of F365 mfc and 3.4% of methanol are introduced into the boiler of an adiabatic distillation column (30 plates). The mixture is then heated to reflux for one hour to bring the system to equilibrium and a fraction of approximately 50 g is then withdrawn and its analysis by gas phase chromatography is carried out together with that of the distillation heel. the results listed in the table which follows show the presence of a positive azeotrope, since its boiling point is lower than that of the pure constituents: F141b, F365 mfc, methanol.

|  | COMPOSITION (weight %) | | |
| --- | --- | --- | --- |
|  | F141b | F365 mfc | Methanol |
| Initial mixture | 79.5 | 17.1 | 3.4 |
| Fraction collected | 79.5 | 17.1 | 3.4 |
| Distillation heel | 79.5 | 17.1 | 3.4 |
| Boiling point corrected for 1.013 bar: 29.1° C. | | | |

This azeotrope, employed for cleaning solder flux or for degreasing mechanical components, gives good results.

EXAMPLE 3

Nitromethane-Stabilized Composition 150 g of a mixture containing, on a weight basis, 79.4% of F141b, 17.1% of F365 mfc, 3.4% of methanol and 0.1% of nitromethane as stabilizer are introduced into an ultrasonic cleaning tank. After the system has been placed under reflux for one hour an aliquot of the vapor phase is removed. Its analysis by gas phase chromatography shows the presence of nitromethane, and this indicates that the mixture is stabilized in the vapor phase.

|  | COMPOSITION (weight %) | | | |
| --- | --- | --- | --- | --- |
|  | F141b | F365 mfc | Methanol | $CH_3NO_2$ |
| Initial mixture | 79.4 | 17.1 | 3.4 | 0.1 |
| Vapor phase | 79.5 | 17.1 | 3.39 | 0.01 |

EXAMPLE 4

Cleaning of Solder Flux 200 g of the F141b/F365 mfc/methanol azeotropic composition are introduced into an Annemasse ultrasonic tank and the mixture is then heated to boiling temperature.

Standardized circuits (model IPC-B-25) coated with solder flux and postcured in the oven for 30 seconds at 220° C. are immersed for 3 minutes in the boiling liquid under ultrasound and are then rinsed in the vapor phase for 3 minutes.

After air drying, a visual inspection under low-angle illumination shows the complete absence of solder flux residue. The same result has thus been obtained as with an F113-methanol composition (93.7%-6.3%).

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

I claim:

1. An azeotropic composition or a composition which has about the same composition in the vapor phase as in the liquid phase when employed at reflux consisting essentially of, on a weight basis, from 75% to 82% of 1,1-dichloro-1-fluoroethane, from 15% to 21% of 1,1,1,3,3-pentafluorobutane and from 3% to 4% of methanol and optionally an effective amount of at least one stabilizer resulting in an azeotropic composition or a composition which has about the same composition in the vapor phase as in the liquid phase when employed at reflux boiling at about 29.1° C. at normal pressure.

2. Composition according to claim 1, wherein the stabilizer is a nitroalkane.

3. Composition according to claim 1, wherein the proportion of stabilizer is from 0.01 to 5% relative to the total weight of the mixture of 1,1-dichloro-1-fluoroethane, 1,1,1,3,3-pentafluorobutane, and methanol.

4. Method for cleaning or drying a solid surface comprising applying an effective amount of the composition according to claim 1 to a solid surface.

5. Method according to claim 4, wherein the solid surface is a printed circuit or a mechanical component.

6. An azeotropic composition or a composition which has about the same composition in the vapor phase as in the liquid phase when employed at reflux boiling at about 29.1° C. at normal pressure, consisting essentially of, on a weight basis, from 60% to 90% of 1,1-dichloro-1-fluoroethane, from 9% to 33% of 1,1,1,3,3,-pentafluorobutane, from 1% to 7% of methanol and optionally an effective amount of at least one stabilizer.

7. Composition according to claim 6, wherein the stabilizer is a nitroalkane.

8. Composition according to claim 6, wherein the proportion of stabilizer is from 0.01 to 5% relative to the total weight of the mixture of 1,1-dichloro-1-fluoroethane, 1,1,1,3,3,-pentafluorobutane and methanol.

9. Method for cleaning or drying a solid surface comprising applying an effective amount of the composition according to claim 6 to a solid surface.

10. Method according to claim 9, wherein the solid surface is a printed circuit or a mechanical component.

* * * * *